United States Patent
Li

(10) Patent No.: US 7,283,800 B2
(45) Date of Patent: Oct. 16, 2007

(54) ADAPTIVE MIXER OUTPUT FILTER BANDWIDTH CONTROL FOR VARIABLE CONVERSION GAIN DOWN-CONVERSION MIXER

(75) Inventor: Qiang Li, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 618 days.

(21) Appl. No.: 10/902,765

(22) Filed: Jul. 30, 2004

(65) Prior Publication Data

US 2006/0025101 A1 Feb. 2, 2006

(51) Int. Cl.
- H04B 1/26 (2006.01)
- H04B 1/18 (2006.01)
- H04B 1/06 (2006.01)
- H04B 7/00 (2006.01)

(52) U.S. Cl. ............... 455/323; 455/177.1; 455/200.1; 455/232.1; 455/277.2

(58) Field of Classification Search ............... 455/323, 455/326, 333, 334, 335, 338, 339, 341, 313, 455/296, 67.13, 67.11, 550.1, 130, 138
See application file for complete search history.

(56) References Cited

U.S. PATENT DOCUMENTS 6,292,652 B1 * 9/2001 Kim ............................ 455/20

2005/0239428 A1 * 10/2005 Seendripu et al. .......... 455/280

\* cited by examiner

Primary Examiner—Tony T. Nguyen
(74) Attorney, Agent, or Firm—Garlick Harrison & Markison; Bruce E. Garlick

(57) ABSTRACT

An improved adaptive mixer for use in the down conversion module of a wireless transceiver. The adaptive mixer comprises a conversion gain module that is operable to receive a radio frequency signal and to generate an intermediate frequency that is provided to a radio interface in a wireless transceiver. The radio interface is operable to generate a gain control signal and a bandwidth control signal. The gain control signal is provided to a gain control module that is operable to select a combination of load resistance values that will provide a predetermined gain level for the output of the conversion gain module. Bandwidth control logic in the adaptive mixer uses the bandwidth control signal to operably connect a plurality of bandwidth control capacitors to the conversion gain module to control the bandwidth of the output signal. By selecting predetermined values for the load resistance and for the bandwidth control capacitors, the method and apparatus of the present invention makes it possible to generate an intermediate frequency output signal having a predetermined gain and a predetermined bandwidth.

33 Claims, 5 Drawing Sheets

ADAPTIVE MIXER OUTPUT FILTER BANDWIDTH CONTROL FOR VARIABLE CONVERSION GAIN DOWN-CONVERSION MIXER

BACKGROUND OF THE INVENTION

1. Field of the Invention

The present invention is directed in general to wireless communication systems. In one aspect, the present invention relates to a method and system for controlling the gain and bandwidth properties of an adaptive mixer in a wireless communication device.

2. Related Art

Communication systems are known to support wireless and wire-lined communications between wireless and/or wire-lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth (BT), advanced mobile phone services (AMPS), digital AMPS, global system for mobile communications (GSM), code division multiple access (CDMA), local multipoint distribution systems (LMDS), multi-channel-multi-point distribution systems (MMDS) and/or variations thereof.

Depending on the type of wireless communication system, a wireless communication device (such as a cellular telephone, two-way radio, personal digital assistant (PDA), personal computer (PC), laptop computer, home entertainment equipment, etc.) communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over the tuned channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switched telephone network, via the Internet, and/or via some other wide area network.

Wireless communication devices typically communicate with one another using a radio transceiver (i.e., receiver and transmitter) that may be incorporated in, or coupled to, the wireless communication device. The transmitter typically includes a data modulation stage, one or more intermediate frequency stages, and a power amplifier. The data modulation stage converts raw data into baseband signals in accordance with a particular wireless communication standard. The intermediate frequency stages mix the baseband signals with one or more local oscillations to produce RF signals. The power amplifier amplifies the RF signals prior to transmission via an antenna. In direct conversion transmitters/receivers, conversion directly between baseband signals and RF signals is performed. The receiver is typically coupled to an antenna and includes a low noise amplifier, one or more intermediate frequency stages, a filtering stage, and a data recovery stage. The low noise amplifier receives inbound RF signals via the antenna and amplifies them. The intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

Wireless communication devices for multimedia audio and video applications generally require a higher data rate than is currently available with devices operating under the 802.11 (a), (b), and (g) standards. Several draft standards (such as the 802.11(n) draft standard) have been proposed to implement faster data rates for wireless devices. Wireless devices operating under these standards will be capable of providing data rates up to 200 Mbps. Since these standards have not been finalized, they will referred to generically as 802.11(x) herein.

Wireless transceivers such as those discussed above in connection with wireless networks employing the various 802.11x standards require very close tolerances to ensure reliable transmission and reception of signals. One of the most important modules in a wireless transceiver is the down converter module wherein incoming radio frequency (RF) signals are converted into an intermediate frequency signal for processing by a baseband unit. A variable gain conversion mixer allows a system level trade-off between linearity and noise figure conversion. Most active mixers have a gain ($g_m$) that is proportional to the load resistance of the mixer. The gain of the mixer, therefore, can be varied by changing the value of the load resistance. Changing the value of the load resistance, however, results in a change of the bandwidth of mixer output filter because the bandwidth is inversely proportional to the load resistance multiplied by the capacitance of the mixer. It is essential in most wireless transceivers that the bandwidth be carefully defined for a particular gain setting. There is a need, therefore, for an improved active filter for use in down conversion modules in wireless interface devices.

SUMMARY OF THE INVENTION

The objects, advantages and other novel features of the present invention will be apparent from the following detailed description when read in conjunction with the appended claims and attached drawings.

The method and apparatus of the present invention provides an improved adaptive mixer for use in the down conversion module of a wireless transceiver. In one embodiment of the present invention, an adaptive mixer comprises an active mixer input module that is operable to receive a radio frequency signal from a low noise amplifier and a local oscillation signal from a local oscillation module. The active mixer module generates an intermediate frequency signal which is provided to a conversion gain generator. The conversion gain generator generates an output signal that is further provided to a radio interface unit for use by a baseband processing module in the wireless transceiver. The radio interface is operable to generate a gain control signal and a bandwidth control signal. The gain control signal is provided to a gain control module comprising a resistor select switch module and a resistor bank comprising a plurality of resistors for generating a predetermined mode resistance. The resistor select module uses the bandwidth gain control signal to select a combination of load resistance values that will provide a predetermined gain level for the output of the conversion gain generator.

Bandwidth control logic in the adaptive mixer uses the bandwidth control signal to control a bandwidth capacitor select switch module that is operable to operably connect a plurality of bandwidth control capacitors to the conversion gain generator to control the bandwidth of the output signal. By selecting predetermined values for the load resistance and for the bandwidth control capacitors, the method and apparatus of the present invention makes it possible to generate an intermediate frequency output signal having a predetermined gain and a predetermined bandwidth.

DETAILED DESCRIPTION

A method and apparatus for an improved wireless communication system is described. While various details are set forth in the following description, it will be appreciated that the present invention may be practiced without these specific details. For example, selected aspects are shown in block diagram form, rather than in detail, in order to avoid obscuring the present invention. Some portions of the detailed descriptions provided herein are presented in terms of algorithms or operations on data within a computer memory. Such descriptions and representations are used by those skilled in the field of communication systems to describe and convey the substance of their work to others skilled in the art. In general, an algorithm refers to a self-consistent sequence of steps leading to a desired result, where a "step" refers to a manipulation of physical quantities which may, though need not necessarily, take the form of electrical or magnetic signals capable of being stored, transferred, combined, compared, and otherwise manipulated. It is common usage to refer to these signals as bits, values, elements, symbols, characters, terms, numbers, or the like. These and similar terms may be associated with the appropriate physical quantities and are merely convenient labels applied to these quantities. Unless specifically stated or otherwise as apparent from the following discussion, it is appreciated that throughout the description, discussions using terms such as processing, computing, calculating, determining, displaying or the like, refer to the action and processes of a computer system, or similar electronic computing device, that manipulates and/or transforms data represented as physical, electronic and/or magnetic quantities within the computer system's registers and memories into other data similarly represented as physical quantities within the computer system memories or registers or other such information storage, transmission or display devices.

Figure 1:
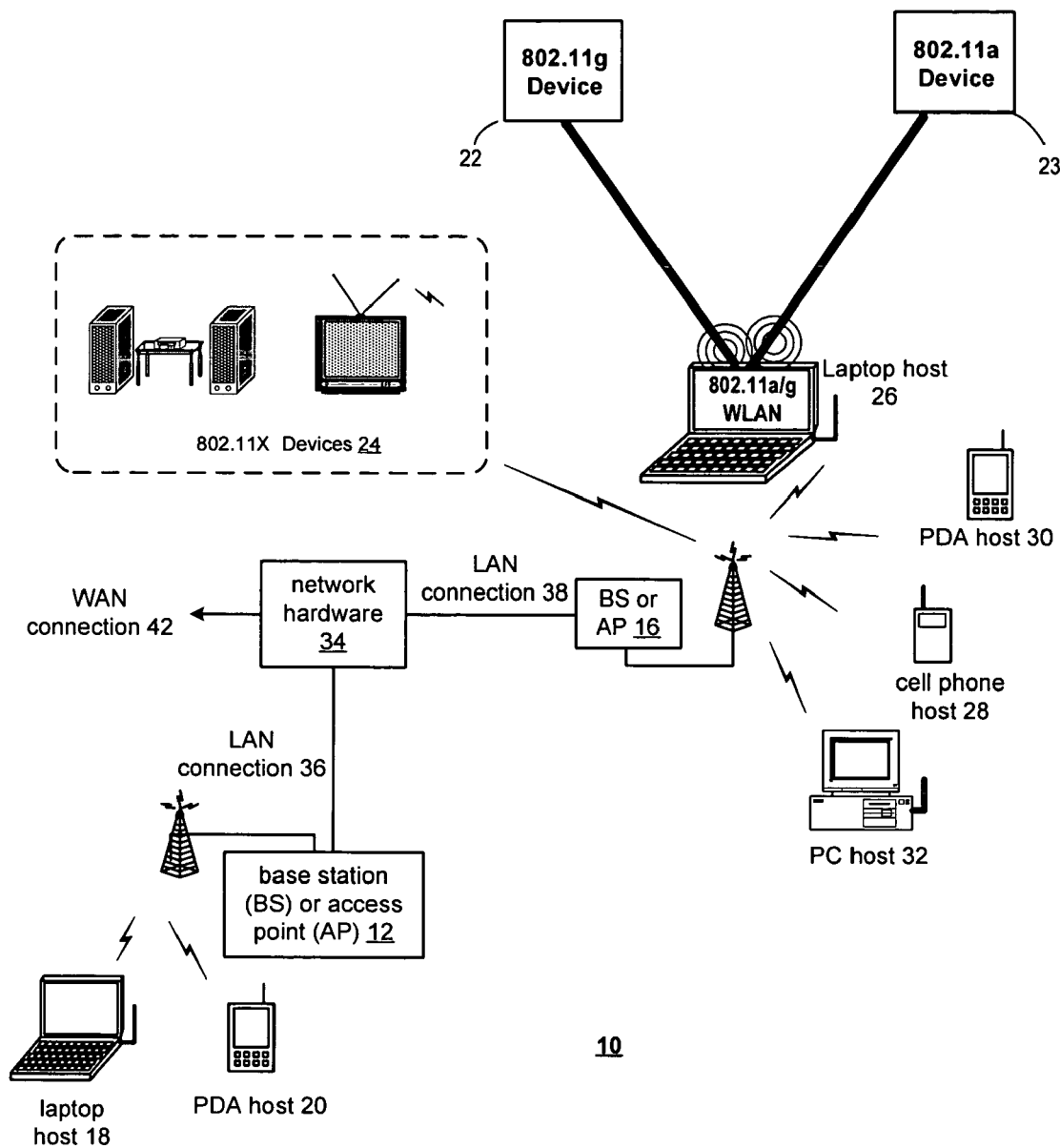
FIG. 1 is a schematic block diagram of a wireless communication system in accordance with the present invention.

FIG. 1 illustrates a wireless communication system 10 in which embodiments of the present invention may operate. As illustrated, the wireless communication system 10 includes a plurality of base stations and/or access points 12, 16, a plurality of wireless communication devices 18-32 and a network hardware component 34. The wireless communication devices 18-32, may be laptop host computers 18 and 26, personal digital assistant hosts 20 and 30, personal computer hosts 32, cellular telephone hosts 28, an 802.11a WLAN device 23, an 802.11g WLAN device 22 and/or an 802.11(x) device 24. The details of the wireless communication devices will be described in greater detail with reference to FIGS. 2-4.

As illustrated, the base stations or access points 12, 16 are operably coupled to the network hardware 34 via local area network connections 36, 38. The network hardware 34 (which may be a router, switch, bridge, modem, system controller, etc.) provides a wide area network connection 42 for the communication system 10. Each of the base stations or access points 12, 16 has an associated antenna or antenna array to communicate with the wireless communication devices in its area. Typically, the wireless communication devices register with a particular base station or access point 12, 16 to receive services from the communication system 10. For direct connections (i.e., point-to-point communications), wireless communication devices communicate directly via an allocated channel. Regardless of the particular type of communication system, each wireless communication device includes a built-in radio and/or is coupled to a radio. The radio includes a highly linear amplifier and/or programmable multi-stage amplifier as disclosed herein to enhance performance, reduce costs, reduce size, and/or enhance broadband applications.

Figure 2:
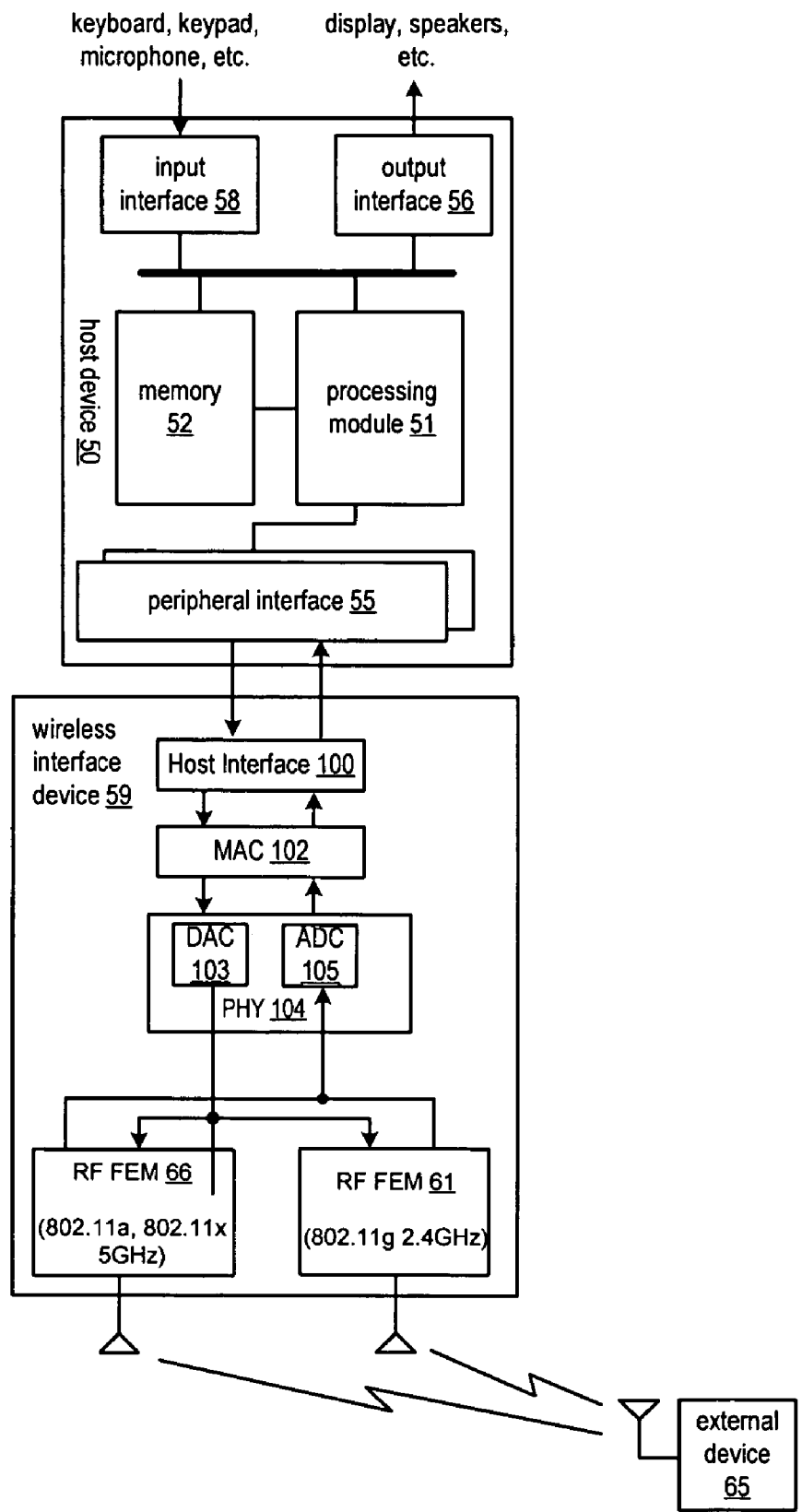
FIG. 2 is a schematic block diagram of a wireless communication device in accordance with the present invention.

FIG. 2 is a schematic block diagram illustrating a radio implemented in a wireless communication device that includes the host device or module 50 and at least one wireless interface device, or radio transceiver 59. The wireless interface device may be built in components of the host device 50 or externally coupled components. As illustrated, the host device 50 includes a processing module 51, memory 52, peripheral interface 55, input interface 58 and output interface 56. The processing module 51 and memory 52 execute the corresponding instructions that are typically done by the host device. For example, in a cellular telephone device, the processing module 51 performs the corresponding communication functions in accordance with a particular cellular telephone standard. For data received from the wireless interface device 59 (e.g., inbound data), the peripheral interface 55 provides the data to the processing module 51 for further processing and/or routing to the output interface 56. The output interface 56 provides connectivity to an output display device such as a display, monitor, speakers, etc., such that the received data may be displayed. The peripheral interface 55 also provides data from the processing module 51 to the wireless interface device 59. The processing module 51 may receive the outbound data from an input device such as a keyboard, keypad, microphone, etc. via the input interface 58 or generate the data itself. For data received via the input interface 58, the processing module 51 may perform a corresponding host function on the data and/or route it to a wireless interface device 59 via the peripheral interface 55.

The wireless interface device 59 includes a host interface 100, a media-specific access control protocol (MAC) layer module 102, a physical layer module (PHY) 104, a digital-to-analog converter (DAC) 103, and an analog to digital converter (ADC) 105. Typically, transmit data coming from the host device 50 is presented to the MAC 102, which in turn presents it to the PHY 104. The PHY 104 processes the transmit data (scrambling, encoding, modulation, etc.) and then transmits its output to the DAC 103 for conversion to an analog signal. The DAC output is then gained and filtered and passed to the front end module 61 or 66. On the receive side, the front end module (61 or 66) output is gained and filtered, then passed to an ADC 105 for conversion to a digital signal. This digital signal is processed (demapped, decoded, descrambled, etc.) by the PHY 104 and the bits are passed through the MAC 102 to the host 50 for delivery to the output interface 56. As will be appreciated, the modules in the wireless interface device are implemented with a communications processor and an associated memory for storing and executing instructions that control the access to the physical transmission medium in the wireless network.

In addition to a first radio transceiver circuit and RF front end 61 (that may or may not be integrated on a common substrate with the wireless interface 59), a second radio transceiver circuit and RF front end 66 is provided and coupled to the wireless interface device 59. For example, the first radio transceiver circuit and RF front end circuit 61 transforms baseband data into a 2.4 GHz signal in accordance with the 802.11g standard, while the second radio transceiver circuit and RF front end circuit 66 transforms baseband data into a 5 GHz signal in accordance with the 802.11a or 802.11x standard.

The external device 65 includes its own wireless interface device for communicating with the wireless interface device of the host device. For example, the host device may be personal or laptop computer and the external devices 65 may be a headset, personal digital assistant, cellular telephone, printer, fax machine, joystick, keyboard, desktop telephone, or access point of a wireless local area network.

Figure 3:
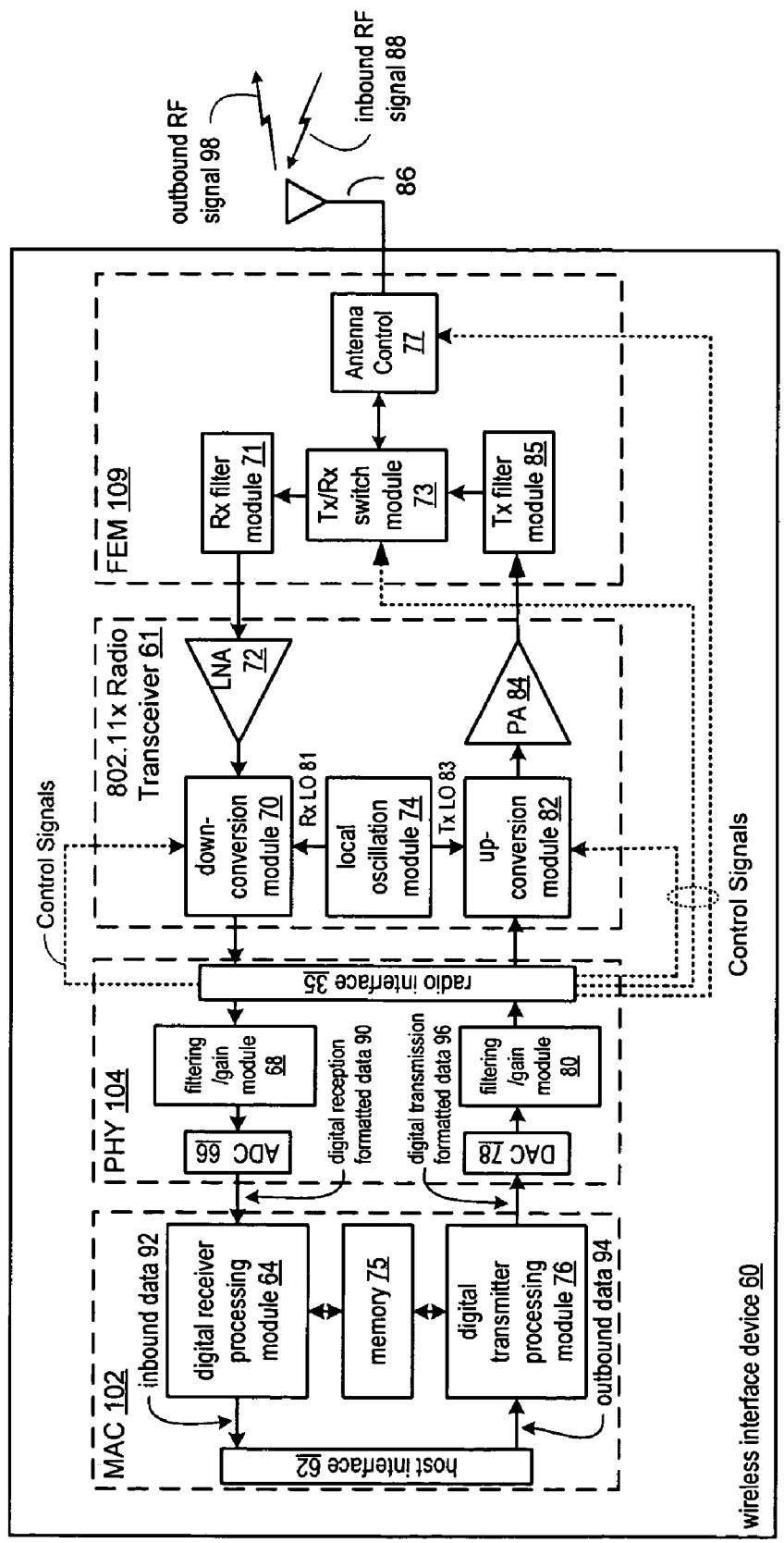
FIG. 3 is a schematic block diagram of a wireless interface device in accordance with the present invention.

FIG. 3 is a schematic block diagram of a wireless interface device (i.e., a radio) 60 which includes a host interface 62, digital receiver processing module 64, an analog-to-digital converter (ADC) 66, a filtering/gain module 68, a down-conversion stage 70, a receiver filter 71, a low noise amplifier 72, a transmitter/receiver switch 73, a local oscillation module 74, memory 75, a digital transmitter processing module 76, a digital-to-analog converter (DAC) 78, a filtering/gain module 80, a mixing up-conversion stage 82, a power amplifier 84, a transmitter filter module 85 and an antenna control 77. The transmitter/receiver switch 73 is coupled to the antenna control 77 through which an antenna 86 is coupled to the wireless interface device. As will be appreciated, the antenna 86 may be a polarized antenna, dual-band antenna with a diplexor, a directional antenna and/or may be physically separated to provide a minimal amount of interference. In addition, the antenna 86 may be used for either transmitting or receiving signals, depending on the switching specified by the transmit/receive switch 73.

The digital receiver processing module 64, the digital transmitter processing module 76 and the memory 75 execute digital receiver functions and digital transmitter functions in accordance with a particular wireless communication standard. The digital receiver functions include, but are not limited to, digital baseband frequency conversion, demodulation, constellation demapping, decoding and/or descrambling. The digital transmitter functions include, but are not limited to, scrambling, encoding, constellation mapping, modulation and/or digital baseband frequency conversion. The digital receiver and transmitter processing modules 64, 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64, 76 implements one or more of its functions via a state machine, analog circuitry, digital circuitry and/or logic circuitry, the memory storing the corresponding operational instructions may be embedded with the circuitry comprising the state machine, analog circuitry, digital circuitry and/or logic circuitry.

In operation, the wireless interface device 60 receives outbound data 94 from the host device via the host interface 62. The host interface 62 routes the outbound data 94 to the digital transmitter processing module 76, which processes the outbound data 94 to produce digital transmission formatted data 96 in accordance with a particular wireless communication standard, such as IEEE 802.11 (including all current and future subsections), Bluetooth, etc. The digital transmission formatted data 96 will be a digital base-band signal or a digital low IF signal, where the low IF typically will be in the frequency range of one hundred kilohertz to a few megahertz. Subsequent stages convert the digital transmission formatted data to an RF signal using a PHY module 104 and radio transmission circuitry, and may be implemented as follows. The digital-to-analog converter 78 converts the digital transmission formatted data 96 from the digital domain to the analog domain. The filtering/gain module 80 filters and/or adjusts the gain of the analog signal prior to providing it to the radio interface module 35. For transmission in accordance with a first signaling protocol (e.g., IEEE 802.11g, or 802.11x), the radio interface module 35 provides the filtered/adjusted analog signal to the up-conversion module 82. The mixing stage 82 directly converts the analog baseband or low IF signal into an RF signal based on a transmitter local oscillation clock 83 provided by local oscillation module 74. The power amplifier 84 amplifies the RF signal to produce outbound RF signal 98, which is filtered by the transmitter filter module 85. Antenna switching control signals provided to the transmit/receive switch module 73 and antenna control module 77 route the outbound RF signal 98 for transmission to a targeted device such as a base station, an access point and/or another wireless communication device via antenna 86.

In accordance with a selected embodiment whereby a signal is to be received in accordance with a first signaling protocol (e.g., IEEE 802.11g or 802.11x), the wireless interface device 60 receives an inbound RF signal 88 from antenna 86 via antenna switch module 73 which was transmitted by a base station, an access point, or another wireless communication device. The inbound RF signal is converted into digital reception formatted data, either directly or through an intermediate frequency conversion process which may be implemented as follows. The antenna control module 77 and transmit/receive switch module 73 provide the inbound RF signal 88 to the receiver filter module 71, where the receiver filter 71 bandpass filters the inbound RF signal 88. The receiver filter 71 provides the filtered RF signal to low noise amplifier 72, which amplifies the signal 88 to produce an amplified inbound RF signal. The low noise amplifier 72 provides the amplified inbound RF signal to the down conversion module 70, which directly converts the amplified inbound RF signal into an inbound low IF signal or baseband signal based on a receiver local oscillation clock 81 provided by local oscillation module 74. The down conversion module 70 provides the inbound low IF signal or baseband signal to the filtering/gain module 68 via the radio interface 35. The filtering/gain module 68 filters and/or gains the inbound low IF signal or the inbound baseband signal to produce a filtered inbound signal. The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by wireless interface device. The host interface 62 provides the recaptured inbound data 92 to the host device (e.g., 50) via the peripheral interface (e.g., 55).

As will be appreciated, the wireless communication device described herein may be implemented using one or more integrated circuits. For example, the host device 50 may be implemented on one integrated circuit, the digital receiver processing module 64, the digital transmitter processing module 76 and memory 75 may be implemented on a second integrated circuit, the remaining components of the wireless interface device 60 may be implemented on a third integrated circuit and the second transceiver and antenna section 40 may be implemented in a fourth integrated circuit. Alternatively, the MAC 102, PHY 104 and radio transceiver 61 may be implemented as one integrated circuit, the FEM 109 may be implemented as a second integrated circuit and the second transceiver and antenna section 40 may be implemented as a third integrated circuit. As another alternate example, the wireless interface device 60 may be implemented on a first integrated circuit and the second transceiver and antenna section 40 may be implemented in a second integrated circuit. As yet another example, the wireless interface device 60 and the second transceiver and antenna section 40 may be implemented in a single integrated circuit. In addition, the processing module 51 of the host device and the digital receiver and transmitter processing modules 64 and 76 may be a common processing device implemented on a single integrated circuit. Further, the memory 52 and memory 75 may be implemented on a single integrated circuit and/or on the same integrated circuit as the common processing modules of processing module 51 and the digital receiver and transmitter processing module 64 and 76.

Figure 4:
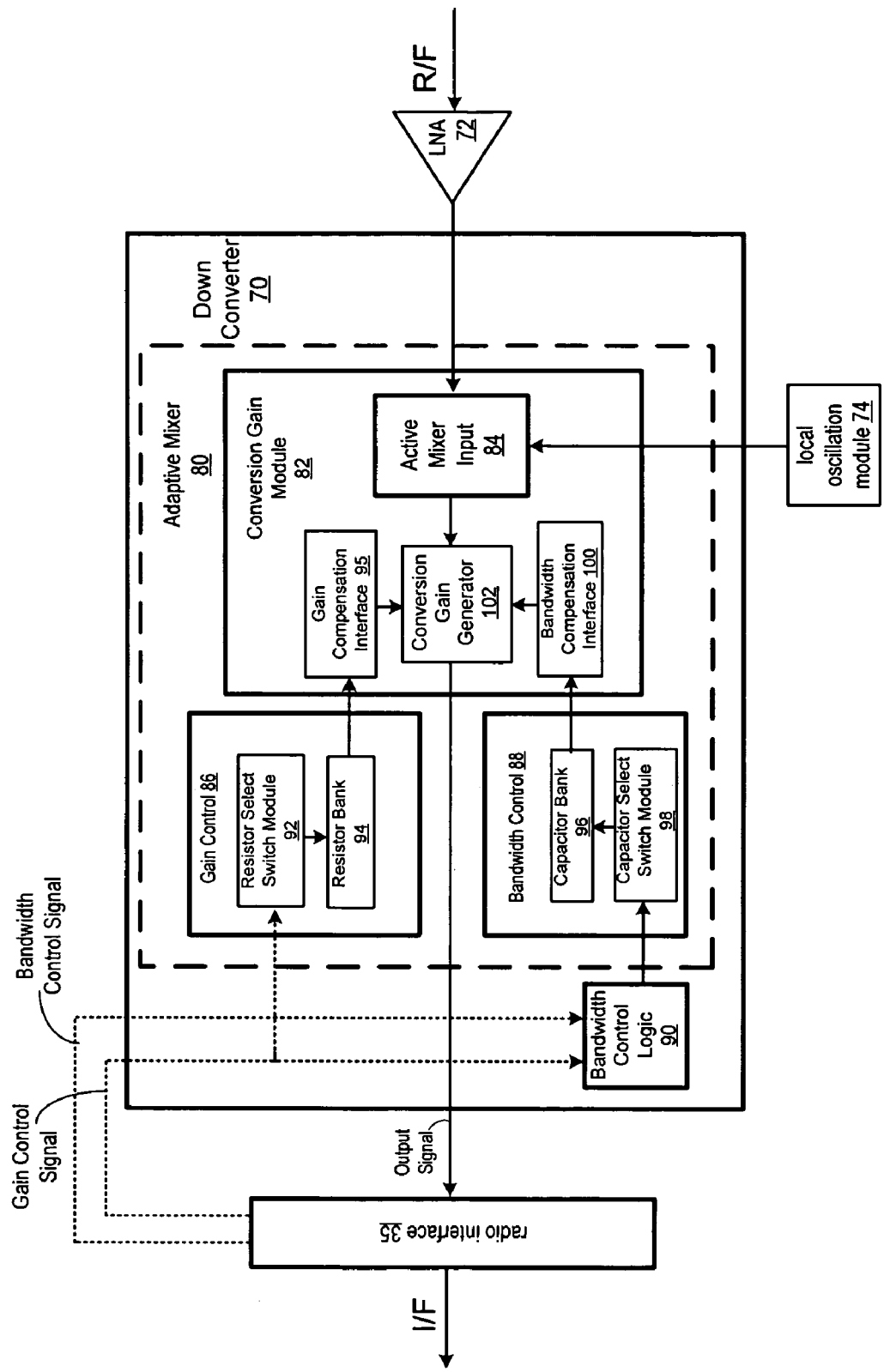
FIG. 4 is a schematic block diagram of the down-converter module of the wireless interface device illustrated in FIG. 3.

Details relating to the adaptive mixer 80 of the present invention can be seen by referring to FIG. 4. As will be understood by those of skill in the art, the gain of the conversion gain mixer is proportional to the load resistance $R_L$, i.e., $Gain \propto g_m R_L$. Furthermore, those of skill in the art will understand that the conversion gain mixer has a characteristic capacitance and the bandwidth associated with the mixer is determined by an RC constant. Therefore, the bandwidth of the mixer can be controlled by changing either the load resistance or the capacitance. Specifically, the bandwidth of the output signal of the mixer is inversely proportional to the RC constant, i.e., $Bandwidth \propto 1/RC$. Therefore, if the gain of the mixer is changed by modifying the load resistance, $R_L$, the RC constant that affects the mixer bandwidth will also be changed. If the gain is modified by changing the load resistance, the capacitance will also need to be changed to maintain a predetermined bandwidth. These gain and bandwidth properties of the adaptive mixer 80 will be discussed in greater detail hereinbelow.

As is shown in FIG. 4, the down converter 70 comprises an adaptive mixer 80 that includes a conversion gain module 82 that receives an RF input signal from the active mixer input module 84. The active mixer input module 84 receives an RF signal from low noise amplifier 72 and a local oscillation input signal from local oscillation module 74. The conversion gain module 82 converts the RF input signal to generate an intermediate frequency (IF) output signal that it provided to the radio interface 35. Operation of the conversion gain module 82 is controlled by the gain control module 86 and the bandwidth control module 88.

As was discussed hereinabove, the radio interface module 35 generates control signals that are used to control operation of the various components in the wireless interface. For operation of the down converter 70, the radio interface generates bandwidth and gain control signals. The gain control signal is provided as an input to resistor select switch module 92 of the gain control module 86. The resistor select switch module 92 is operable to select one or more resistors that are used to provide a load resistance to cause the conversion gain module 82 to provide a predetermined gain factor for the conversion of the input RF signal to the IF signal. The gain control signal is also provided as an input to bandwidth control logic module 90 which is operable to generate an input signal to capacitor select switch module 96, thereby causing a predetermined combination of capacitors in capacitor bank 98 to provide a capacitor input signal to the bandwidth compensation interface 100.

The gain compensation interface 95 provides a load resistance ($R_L$) that is used by the conversion gain generator 84 to determine the gain factor for generating the output intermediate frequency signal. Likewise, the bandwidth compensation interface 100 provides a conversion gain capacitor value that is used by the conversion gain generator to determine the bandwidth for the intermediate frequency output signal.

In the method and apparatus of the present invention, the bandwidth of the mixer is modified subsequent to changing the gain to maintain the system at a predetermined bandwidth. In one embodiment of the invention, resistor and capacitor combinations are provided for three different bandwidths. Specifically, bandwidths adjustment are provided for RF input signals at 10 MHz, 20 MHz, and 40 MHz.

Figure 5:
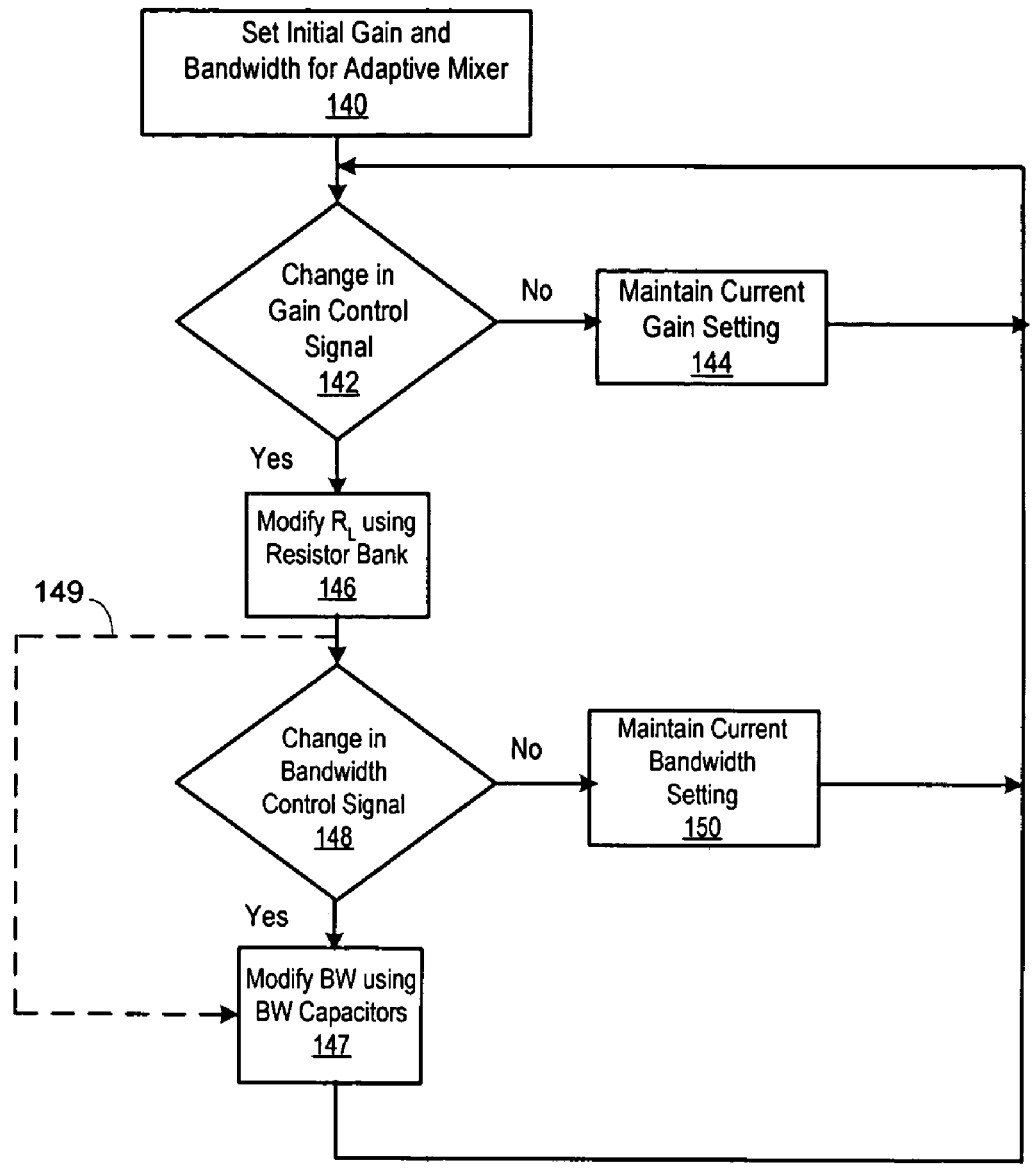
FIG. 5 is a flow chart description for using the present invention to improve the phase margin of a common mode feedback phase margin of a variable-output-bandwidth mixer.

FIG. 5 is a flow chart of the processing steps for implementing the present invention. In step 140, the initial gain and the initial bandwidth is set for the adaptive mixer 80. In step 142, a test is conducted to determine whether there has been a change in the gain control signal. If the result of the test conducted in step 142 indicates that no change in the gain control signal has occurred, processing proceeds to step 144 and the current gain setting is maintained. Processing then returns to step 142. If, however, the results of the test conducted in step 142 indicate that the gain control signal has changed, processing proceeds to step 146 wherein the gain control signal is used to modify the value of the load resistance $R_L$ using the resistor bank 94. The bandwidth for the adaptive mixer is then adjusted in step 147 as illustrated by dashed line 149. Processing then returns to step 148 wherein a test is conducted to determine whether there has been a change in the bandwidth control signal. If the results of the test conducted in step 148 indicate that there has not been a change in the desired bandwidth, the current bandwidth settings are maintained in step 150 and processing returns to step 142. If, however, the results of the test conducted in step 148 indicate that there has been a change in the bandwidth control signal, processing proceeds to step 147 wherein the bandwidth is adjusted by further changing the BW capacitance and processing proceeds again to step 142 as discussed hereinabove.

OTHER EMBODIMENTS

Other embodiments are within the following claims.

Although the present invention has been described in detail, it should be understood that various changes, substitutions and alterations can be made hereto without departing from the spirit and scope of the invention as defined by the appended claims.

What is claimed is:

1. An adaptive mixer, comprising:
   a conversion gain module operable to receive a radio frequency signal and to generate an intermediate frequency signal therefrom, wherein said intermediate frequency signal has a predetermined first bandwidth;
   a gain control module operable to change the gain of said conversion gain module from a first gain to a second gain, thereby generating an intermediate frequency signal at a second gain, wherein said intermediate frequency signal generated at said second gain has a second bandwidth;
   a bandwidth control module operable to change the bandwidth of said intermediate frequency signal from said second bandwidth to said first predetermined bandwidth.

2. The adaptive mixer of claim 1, wherein said first and second gains of said conversion gain module are defined by first and second load resistances of said conversion gain module.

3. The adaptive mixer of claim 2, wherein said gain control module is operable to change said gain of said conversion gain module from said first gain to said second gain by operably coupling a second load resistance to said conversion gain module.

4. The adaptive mixer of claim 3, wherein said second load resistance comprises a predetermined combination of resistors selected from a resistor bank module.

5. The adaptive mixer of claim 3, wherein said bandwidth control module is operable to detect said second load resistance and is operable to change the bandwidth of said intermediate frequency signal from said second bandwidth to said first predetermined bandwidth upon detection of said second load resistance.

6. The adaptive mixer of claim 5,
   wherein said predetermined first bandwidth and said second bandwidth are defined by first and second RC constants of said conversion gain module, and wherein the resistance component of said first and second RC constants is determined by said first and second load resistances corresponding to said first and second gains, and
   wherein said bandwidth control module is operable to connect a capacitance to said conversion gain module to cause said second RC constant to have a value corresponding to said predetermined first bandwidth.

7. The adaptive mixer of claim 6, wherein said capacitance comprises a predetermined combination of capacitors in a capacitor bank.

8. The adaptive mixer of claim 6, wherein said intermediate frequency is provided to a radio interface that is operably connected to baseband signal processing components, wherein said radio interface is operable to generate a gain control signal to cause said conversion gain module to change its gain from said first gain to said second gain.

9. The adaptive mixer of claim 8, wherein said radio interface is further operable to generate a gain control signal to cause said conversion gain module to generate said intermediate frequency at said second gain with said first predetermined bandwidth.

10. The adaptive mixer of claim 9, further comprising a bandwidth control module, wherein said bandwidth control module receive said gain control signal and said bandwidth control signal and generates a bandwidth modification signal in response thereto.

11. The adaptive mixer of claim 10, wherein said bandwidth modification signal is provided to a capacitor select switch module that operably connects a predetermined combination of capacitors to said conversion gain module to generate said intermediate frequency at said second gain with said first predetermined bandwidth.

12. A method of generating an intermediate frequency using an adaptive mixer, comprising:
   receiving a radio frequency signal and using a conversion gain module to generate an intermediate frequency signal therefrom, wherein said intermediate frequency signal has a predetermined first bandwidth;
   changing the gain of said conversion gain module from a first gain to a second gain, thereby generating an intermediate frequency signal at a second gain, wherein said intermediate frequency signal generated at said second gain has a second bandwidth; and
   changing the bandwidth of said intermediate frequency signal from said second bandwidth to said first predetermined bandwidth.

13. The method of claim 12, wherein said first and second gains of said conversion gain module are defined by first and second load resistances of said conversion gain module.

14. The method of claim 13, wherein said gain of said conversion gain module is changed from said first gain to said second gain by operably coupling a second load resistance to said conversion gain module.

15. The method of claim 14, wherein said second load resistance comprises a predetermined combination of resistors selected from a resistor bank module.

16. The method of claim 14, wherein said change from said first load resistance to said second load resistance is detected by a bandwidth control module that is operable to change the bandwidth of said intermediate frequency signal from said second bandwidth to said first predetermined bandwidth upon detection of said second load resistance.

17. The method of claim 16,
   wherein said predetermined first bandwidth and said second bandwidth are defined by first and second RC constants of said conversion gain module, and wherein the resistance component of said first and second RC constants is determined by said first and second load resistances corresponding to said first and second gains, and
   wherein said bandwidth control module is operable to connect a capacitance to said conversion gain module to cause said second RC constant to have a value corresponding to said predetermined first bandwidth.

18. The method of claim 17, wherein said capacitance comprises a predetermined combination of capacitors in a capacitor bank.

19. The method of claim 17, wherein said intermediate frequency is provided to a radio interface that is operably connected to baseband signal processing components, wherein said radio interface is operable to generate a gain control signal to cause said conversion gain module to change its gain from said first gain to said second gain.

20. The method of claim 19, wherein said radio interface generates a gain control signal to cause said conversion gain module to generate said intermediate frequency at said second gain with said first predetermined bandwidth.

21. The method of claim 20, wherein said gain control signal and said gain control signal are received by a bandwidth control module that generates a bandwidth modification signal in response thereto.

22. The method of claim 21, wherein said bandwidth modification signal is received by a capacitor select switch module that operably connects a predetermined combination of capacitors to said conversion gain module to generate said intermediate frequency at said second gain with said first predetermined bandwidth.

23. A wireless interface system that services communications between a wirelessly enabled host and at least one user input device, comprising:
   a front end module operable to receive an incoming signal at an RF frequency;
   a transceiver module operable to process said incoming signal at an RF frequency and to generate an intermediate (IF) frequency signal therefrom; wherein said transceiver module further comprises:
   a conversion gain module operable to receive a radio frequency signal and to generate an intermediate frequency signal therefrom, wherein said intermediate frequency signal has a predetermined first bandwidth;
   a gain control module operable to change the gain of said conversion gain module from a first gain to a second gain, thereby generating an intermediate frequency signal at a second gain, wherein said intermediate frequency signal generated at said second gain has a second bandwidth;
   a bandwidth control module operable to change the bandwidth of said intermediate frequency signal from said second bandwidth to said first predetermined bandwidth; and
   processing circuitry operable to receive said IF frequency signal and to generate digital data signals therefrom.

24. The wireless interface device of claim 23 wherein said first and second gains of said conversion gain module are defined by first and second load resistances of said conversion gain module.

25. The wireless interface device of claim 24, wherein said gain control module is operable to change said gain of said conversion gain module from said first gain to said second gain by operably coupling a second load resistance to said conversion gain module.

26. The wireless interface device of claim 25, wherein said second load resistance comprises a predetermined combination of resistors selected from a resistor bank module.

27. The wireless interface device of claim 25, wherein said bandwidth control module is operable to detect said second load resistance and is operable to change the bandwidth of said intermediate frequency signal from said second bandwidth to said first predetermined bandwidth upon detection of said second load resistance.

28. The wireless interface device of claim 27,
   wherein said predetermined first bandwidth and said second bandwidth are defined by first and second RC constants of said conversion gain module, and wherein the resistance component of said first and second RC constants is determined by said first and second load resistances corresponding to said first and second gains, and
   wherein said bandwidth control module is operable to connect a capacitance to said conversion gain module to cause said second RC constant to have a value corresponding to said predetermined first bandwidth.

29. The wireless interface device of claim 28, wherein said capacitance comprises a predetermined combination of capacitors in a capacitor bank.

30. The wireless interface device of claim 28, wherein said intermediate frequency is provided to a radio interface that is operably connected to baseband signal processing components, wherein said radio interface is operable to generate a gain control signal to cause said conversion gain module to change its gain from said first gain to said second gain.

31. The wireless interface device of claim 30, wherein said radio interface is further operable to generate a gain control signal to cause said conversion gain module to generate said intermediate frequency at said second gain with said first predetermined bandwidth.

32. The wireless interface device of claim 31, further comprising a bandwidth control module, wherein said bandwidth control module receive said gain control signal and said bandwidth control signal and generates a bandwidth modification signal in response thereto.

33. The wireless interface device of claim 32, wherein said bandwidth modification signal is provided to a capacitor select switch module that operably connects a predetermined combination of capacitors to said conversion gain module to generate said intermediate frequency at said second gain with said first predetermined bandwidth.

* * * * *